(12) United States Patent  
Lee

(10) Patent No.: US 10,468,243 B2
(45) Date of Patent: Nov. 5, 2019

(54) METHOD OF MANUFACTURING SEMICONDUCTOR DEVICE AND METHOD OF CLEANING SUBSTRATE

(71) Applicant: TAIWAN SEMICONDUCTOR MANUFACTURING CO., LTD., Hsinchu (TW)

(72) Inventor: Chung-Chieh Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/907,663

(22) Filed: Feb. 28, 2018

(65) Prior Publication Data

US 2019/0157070 A1     May 23, 2019

Related U.S. Application Data

(60) Provisional application No. 62/590,181, filed on Nov. 22, 2017.

(51) Int. Cl.
*H01L 21/02*     (2006.01)
*C11D 3/22*      (2006.01)
(Continued)

(52) U.S. Cl.
CPC ........ *H01L 21/02057* (2013.01); *C11D 1/008* (2013.01); *C11D 3/162* (2013.01);
(Continued)

(58) Field of Classification Search
CPC ... H04W 48/10; H04W 48/14; H04W 72/005; H04W 72/0446; H04W 72/0453; H04W 72/046; H04W 72/048; H04W 72/0413; Y02D 70/00; Y02D 70/1262; Y02D 70/1264; H01L 21/02065; H01L 21/32136; H01L 21/31116; H01L 21/02057; H01L 21/67051; H01L 21/0206; H01L 21/02068; H01L 21/02074; H01L 21/266; H01L 21/30625; H01L 21/3065; H01L 21/31053;
(Continued)

(56) References Cited

U.S. PATENT DOCUMENTS 4,777,804 A   10/1988   Bowling et al.
5,709,755 A    1/1998   Kuo et al.
(Continued)

FOREIGN PATENT DOCUMENTS

CN        106816381 A      6/2017

OTHER PUBLICATIONS

"Combination of Organic and Inorganic Materials", Shin-Etsu Silicone, 2017 (27 pages).
(Continued)

*Primary Examiner* — Lan Vinh
(74) *Attorney, Agent, or Firm* — McDermott Will & Emery LLP

(57) ABSTRACT

In a method of cleaning a substrate, a solution including a size-modification material is applied on a substrate, on which particles to be removed are disposed. Size-modified particles having larger size than the particles are generated, from the particles and the size-modification material. The size-modified particles are removed from the substrate.

18 Claims, 16 Drawing Sheets

(51) Int. Cl.

| | | |
|---|---|---|
| *C11D 1/00* | (2006.01) | |
| *C11D 3/16* | (2006.01) | |
| *C11D 11/00* | (2006.01) | |
| *H01L 21/67* | (2006.01) | |
| *C11D 3/37* | (2006.01) | |
| *H01L 21/3105* | (2006.01) | |
| *H01L 21/266* | (2006.01) | |
| *H01L 21/3065* | (2006.01) | |
| *H01L 21/306* | (2006.01) | |
| *H01L 21/311* | (2006.01) | |
| *H01L 21/3213* | (2006.01) | |
| *H01L 21/321* | (2006.01) | |

(52) U.S. Cl.
CPC ............ *C11D 3/222* (2013.01); *C11D 3/3757* (2013.01); *C11D 11/0047* (2013.01); *H01L 21/67051* (2013.01); *H01L 21/0206* (2013.01); *H01L 21/02065* (2013.01); *H01L 21/02068* (2013.01); *H01L 21/02074* (2013.01); *H01L 21/266* (2013.01); *H01L 21/3065* (2013.01); *H01L 21/30625* (2013.01); *H01L 21/31053* (2013.01); *H01L 21/31058* (2013.01); *H01L 21/31116* (2013.01); *H01L 21/31138* (2013.01); *H01L 21/3212* (2013.01); *H01L 21/32136* (2013.01)

(58) Field of Classification Search
CPC ......... H01L 21/31058; H01L 21/31138; H04B 7/0456; H04B 7/0626; H04B 7/063; H04B 7/0632; H04B 7/0636; H04B 7/0639; H04B 7/0645; H04L 25/0204; H04L 5/0057; C11D 1/008; C11D 11/0047; C11D 3/162; C11D 3/222; C11D 3/3757
USPC ....... 438/706, 710, 712, 714, 719, 722, 780; 134/1.2, 1.3, 1.4, 1.1, 3
See application file for complete search history.

(56) References Cited

U.S. PATENT DOCUMENTS

| | | | |
|---|---|---|---|
| 8,227,394 B2* | 7/2012 | Zhu | C11D 3/222 |
| | | | 510/175 |
| 2004/0043620 A1 | 3/2004 | Ying et al. | |
| 2009/0289288 A1 | 11/2009 | Wu | |
| 2010/0016202 A1* | 1/2010 | Mui | B08B 7/0014 |
| | | | 510/175 |
| 2011/0306210 A1 | 12/2011 | Kashkoush et al. | |
| 2014/0213060 A1* | 7/2014 | Kao | H01L 21/31144 |
| | | | 438/703 |
| 2015/0340490 A1 | 11/2015 | An et al. | |
| 2016/0035849 A1 | 2/2016 | Ching et al. | |
| 2016/0319160 A1* | 11/2016 | Prevo | C09G 1/18 |
| 2017/0069763 A1 | 3/2017 | Doris et al. | |
| 2017/0154958 A1 | 6/2017 | Fung et al. | |
| 2017/0243737 A1 | 8/2017 | Tanigaki et al. | |

OTHER PUBLICATIONS

O'Neill, M.E., "A Sphere in Contact with a Plane Wall in a Slow Linear Shear Flow", Chemical Engineering Science, 1968, vol. 23, pp. 1293-1298.

* cited by examiner

US 10,468,243 B2

METHOD OF MANUFACTURING SEMICONDUCTOR DEVICE AND METHOD OF CLEANING SUBSTRATE

RELATED APPLICATIONS

This application claims priority to US Provisional patent application No. 62/590,181 filed on Nov. 22, 2017, the entire disclosure of which is incorporated herein by reference.

TECHNICAL FIELD

The present disclosure relates to method of manufacturing semiconductor device and/or flat panel displays and, more particularly, to methods of cleaning wafers and/or substrates.

BACKGROUND

During manufacturing of semiconductor devices and/or flat panel displays, various processes, such as etching, depositing, and/or polishing, causes particles and defects on a semiconductor wafer, a glass substrate or other substrates. Although various cleaning operations are performed to reduce the defects and/or particles, it is generally difficult to nano-meter order particles.

DETAILED DESCRIPTION

Figure 1:
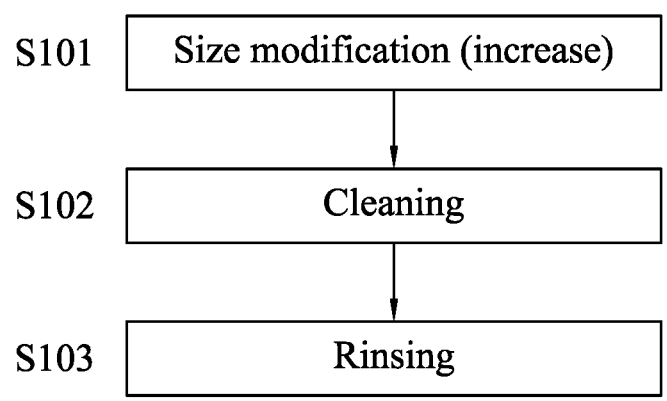
FIG. 1 is a flow chart illustrating a method of cleaning a substrate according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Various cleaning operations have been proposed and utilized in semiconductor manufacturing operations to remove particles on wafers. For example, jet spraying methods or ultrasonic cleaning methods have been utilized. However, as the minimum pattern sizes decrease, more gentle cleaning operations that do not cause damage to fabricated patterns by mechanical force are needed. In addition, as the minimum pattern sizes decrease, sizes of particles to be removed from the wafers also decrease.

The hydrodynamic drag force is one of the key factors for effective particle cleaning or removal. The hydrodynamic drag force Ft is a force that acts on an object (e.g., particles) in a flowing fluid and is proportional to the square of particle size as shown below.

$$Ft = \frac{C_d \pi \rho_g d^2 V^2}{C_c}.$$ (Equation 1)

In Equation 1, d is a particle diameter, $\rho_g$ is a fluid density, V is a relative velocity of the fluid with respect to the particle, $C_d$ is a drag coefficient, and $C_c$ is the Cunningham slip correction factor. When the hydrodynamic drag force Ft is larger than an adhesion force that makes a particle adhere on the surface of the wafer, the particle is removed from the wafer by the flowing fluid. From Equation 1, it is understood that the hydrodynamic drag force Ft on nano-size particles would rapidly decrease, which would cause low particle removal efficiency. One option to increase the hydrodynamic drag force Ft, to increase the fluid velocity (e.g., droplet velocity of the fluid from a spray nozzle. However, as set forth above, higher fluid velocity could cause damage on fabricated patterns.

In the present disclosure, techniques to increase a particle size (diameter d) in order to increase the hydrodynamic drag force Ft are disclosed. By increasing particle size, a particle removal efficiency can be improved.

FIG. 1 is a flow chart illustrating a method of cleaning a substrate according to an embodiment of the present disclosure. It is understood that additional operations can be provided before, during, and after processes shown by FIG. 1, and some of the operations described below can be replaced or eliminated, for additional embodiments of the method.

Initially, a wafer or a substrate, on which particles to be removed exist, is prepared. The substrate includes a semiconductor wafer or a glass substrate in some embodiments. The sizes of some of the particles are less than about 40 nm, and ranges from about 0.1 nm to about 40 nm in some embodiments. Particles having sizes of more than about 40 nm can be included in the particles on the substrate. In S101 of FIG. 1, a size modification operation is performed. In the size modification operation, the sizes of the particles are increased through chemical modifications on the particles' surfaces or interaction between one or more chemical agents and the particles.

In S102 of FIG. 1, after the sizes of the particles are increased, the substrate is cleaned or washed with an appropriate cleaning solution. Then, in S103 of FIG. 1, a rinsing operation using de-ionized water is performed.

FIGS. 2A-3C illustrate a method of cleaning a substrate according to an embodiment of the present disclosure. It is understood that additional operations can be provided before, during, and after processes shown by FIGS. 2A-3C, and some of the operations described below can be replaced or eliminated, for additional embodiments of the method. FIGS. 2A-3C illustrate details of the cleaning operation shown by FIG. 1.

Figure 2A:
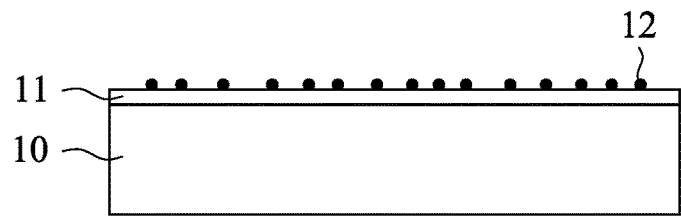
FIGS. 2A, 2B and 2C illustrate a method of cleaning a substrate according to an embodiment of the present disclosure.

As shown in a cross sectional view of FIG. 2A, a substrate 10, on which particles 12 to be removed exist, is prepared. The substrate 10 includes a semiconductor wafer or a glass substrate in some embodiments. In one embodiment, a semiconductor wafer is used. In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure. In other embodiments, the substrate 10 is a rectangular glass substrate for a flat panel display, such as a liquid crystal display (LCD) and an organic electroluminescent display. In certain embodiments, the substrate 10 is a glass substrate for a solar panel.

In some embodiments, one or more layers 11 are disposed on the substrate 10. In some embodiments, one or more of the layers 11 are patterned. In other embodiments, the one or more layers 11 have no patterns. In some embodiments, the one or more layers 11 includes an insulating material layer, a conductive material layer, an organic material layer, an inorganic material layer, a metallic layer or any combination thereof.

The particles 12 are any kind of particles made of, for example, organic materials, inorganic materials, dielectric materials, ceramic materials and/or metal or metallic materials in some embodiments. The particles 12 include nano-particles having sizes of less than about 50 nm in some embodiments. In certain embodiments, the size of the nano-particles ranges from about 0.1 nm to about 40 nm. Larger size particles having sizes of more than about 50 nm can be included in the particles 12. The particles 12 adhere on the surface of the substrate 10 by physical absorption by van der Waals force and/or chemical absorption by chemical bonding. The chemical bonding includes hydrogen bonding and ionic bonding.

Figure 2B:
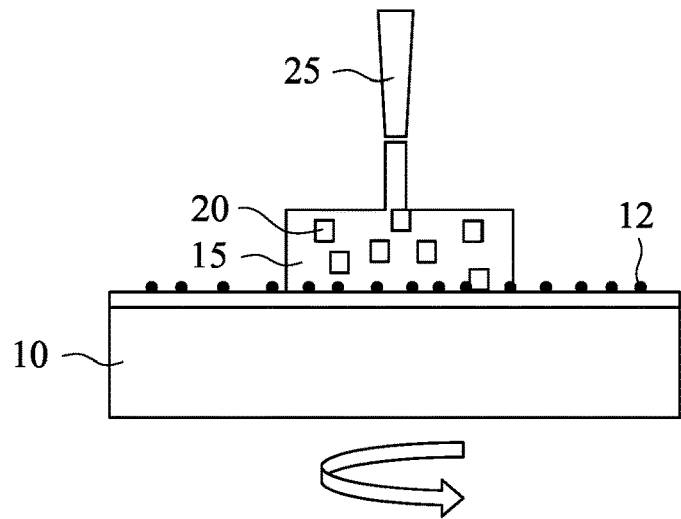

In a cross sectional view of FIG. 2B, a chemical solution 15 is applied, from a nozzle 25, onto the surface of the substrate 10 having the particles 12. The chemical solution 15 contains one or more chemical agents 20 that can modify (increase) the size of the particles 12 on the substrate 10. As shown in FIG. 2B, the chemical solution 15 is spin-coated on the surface of the substrate 10 in some embodiments. Other methods, such as spraying, can also be utilized to apply the chemical solution 15 over the substrate 10. In some embodiments, the chemical solution 15 is applied onto the surface of the substrate for a time period, for example, about 1 sec to 30 sec, and then the substrate is kept spinning to obtain a desired thickness of a film formed from the chemical agent 20 contained in the chemical solution 15.

Figure 2C:
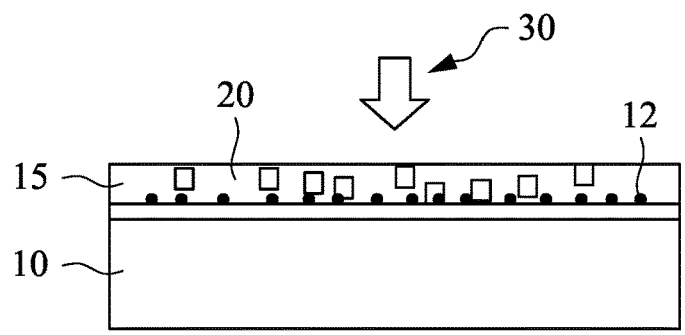
Figure 3A:
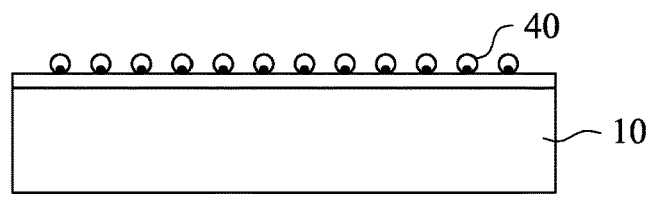
FIGS. 3A, 3B and 3C illustrate a method of cleaning a substrate according to an embodiment of the present disclosure.

By applying the chemical solution 15, the chemical solution covers substantially the entire surface of the substrate 10 as shown in FIG. 2C. Then, the one or more chemical agents 15 react with the particles 12 disposed over the substrate 10, thereby forming size-modified particles 40 as shown in FIG. 3A.

Figure 4A:
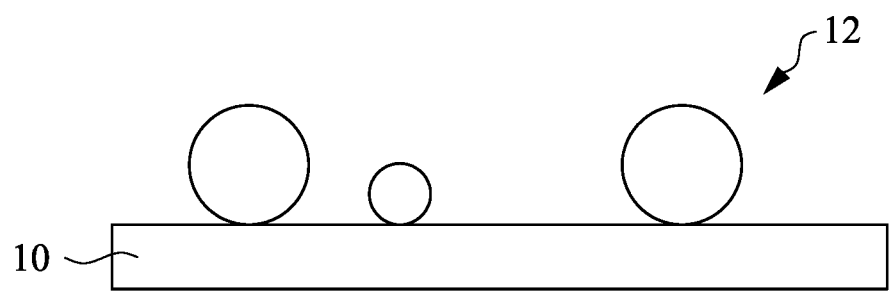
FIG. 4A shows a schematic view of particles on a substrate relating to an embodiment of the present disclosure.
Figure 4B:
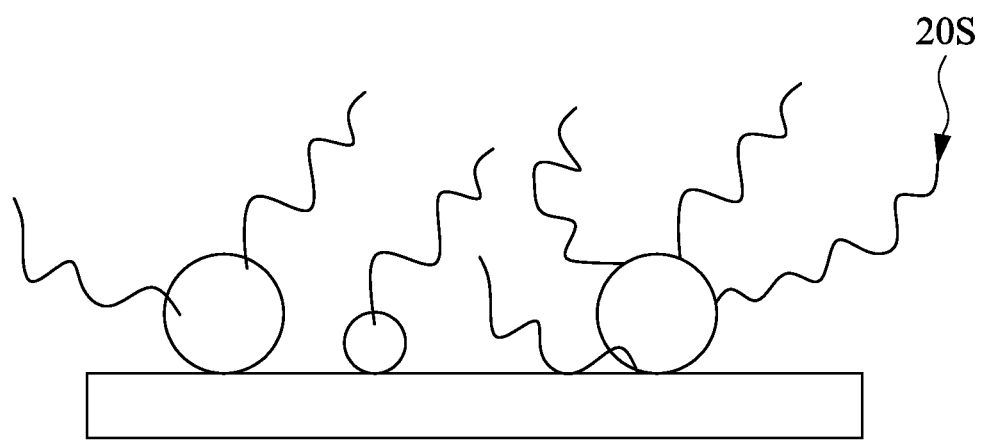
FIG. 4B shows a schematic view of particles size-modified with a surface modifier according to an embodiment of the present disclosure.

In some embodiments, the chemical agent is a surface modifier that can couple with the surface of the particles 12, thereby increasing the size of the particles 12. As shown in FIGS. 4A and 4B, one or more surface modifiers 20S are coupled to the surface of particles 12, and the effective size of the particles that can produce the hydrodynamic drag force Ft is increased.

Figure 5A:
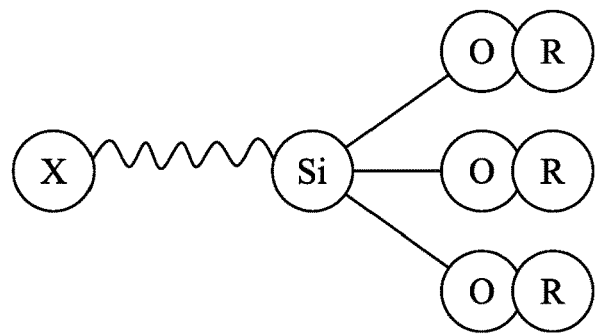
FIG. 5A shows a schematic view of a silane coupling agent relating to an embodiment of the present disclosure.

In some embodiments, the surface modifier 20S is a silane coupling agent. A silane coupling agent has a general formula $SiX(OR)_3$, where X is functional group coupled to Si and R is an alkoxy group, such as $-OCH_3$, $-OC_2H_5$ or $-OCOCH_3$, as shown in FIG. 5A in some embodiments. An alkyl chain linker connects the functional group X and Si in some embodiments. In other embodiments, a silane coupling agent has a general formula $SiX(CH_3)_n(OR)_{3-n}$, where X is functional group coupled to Si and R is an alkoxy group. X can be a hydrogen.

Figure 5B:
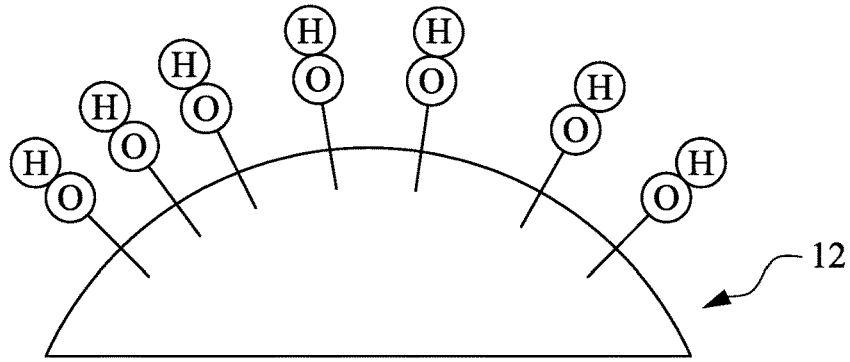
FIG. 5B shows a schematic view of a surface structure of a particle relating to an embodiment of the present disclosure.
Figure 5C:
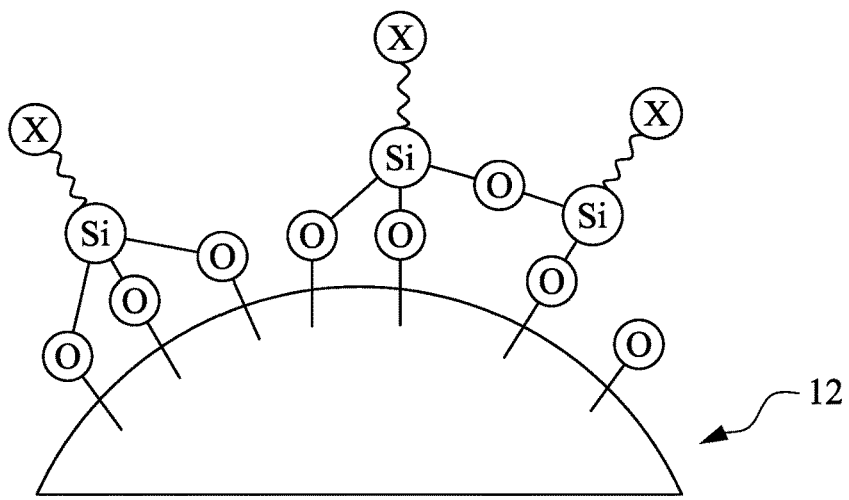
FIG. 5C shows a schematic view of a surface structure after a silane coupling agent is reacted relating to an embodiment of the present disclosure.

As shown in FIG. 5B, the surface of a particle 12 has —OH bonds. After a silane coupling agent is applied to the surface of the particle 12, the silane coupling agent is bonded to the surface of the particle 12 through hydrolysis and dehydration processes. Accordingly, the effective size of the particles can be increased.

In some embodiments, the functional group X is directly bonded to Si or connected to Si by an alkyl chain having a carbon number 1-18. In other embodiments, the alkyl chain has a carbon number 1-10. In certain embodiments, the alkyl chain has a straight chain. In other embodiments, the functional group X is connected to Si by a ketone.

Examples of the silane coupling agent are: a vinyl based silane, such as vinyltrimethoxysilane, vinyltriethoxysilane or 7-octenyltrimethoxysilane; an epoxy based silane, such as 2-(3,4 epoxycyclohexyi) ethyltrimethoxysilane, 3-glycidoxypropyl methyldimethoxysllane, 3-glycidoxypropyl trimethoxysilane, 3-glycidoxypropyl methyldiethoxysilane, 3-glycidoxypropyl triethoxysilane or 8-glycidoxyoctyl trimethoxysilane; a methacryloxy based silane, such as 3-methacryloxypropyl methyldimethoxysilane, 3-methacryloxypropyl trimethoxysilane, 3-methacryloxypropyl methyldiethoxysilane, 3-methacryloxypropyl triethoxysilane, or 8-methacryloxyoctyltrimethoxysilane; an acryloxy based silane, such as 3-acryloxypropyl trimethoxysilane; an amino based silane, such as N-2-(aminoethyl)-3-aminopropylmethyldimethoxysilane, N-2-(aminoethyl)-3-aminopropyltrimethoxysilane, 3-aminopropyltriethoxysilane, 3-aminopropyltriethoxysilane, 3-triethoxysilyl-N-(1,3 dimethylbutylidene) propylamine, N-phenyl-3-aminopropyl trimethoxysilane, or N-2-(aminoethyl)-8-aminooctyl trimethoxysilane; an isocyanate based silane, such as 3-isocyanatepropyl triethoxysilane; a mercapto based silane, such as 3-mercaptopropyl methyldimethoxysllane, or 3-mercaptopropyl trimethoxysilane; a styryl based silane, such as p-styryltrimethoxysilane; a ureide based silane, such as 3-ureidopropyltrialkoxysilane; and a isocyanurate based silane, such as tris-(trimethoxysilylpropyl) isocyanurate, or tris-(triethoxysilylpropyl) isocyanurate. The silane coupling agent is used singly or two or more silane coupling agents are used as the surface modifier 20S.

Figure 4C:
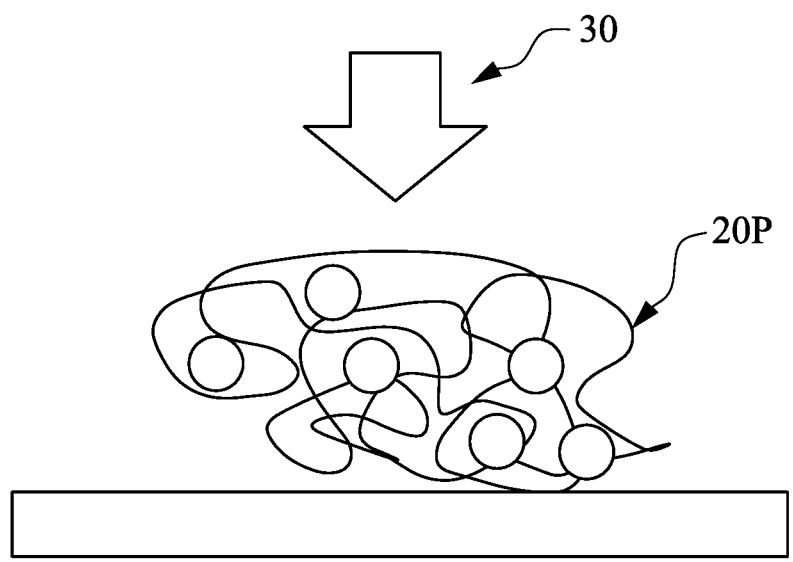
FIG. 4C shows a schematic view of particles size-modified with a polymer according to an embodiment of the present disclosure.

In other embodiments, the chemical agent 20 contained in the chemical solution 15 is a polymer or a polymerizable material 20P as shown in FIG. 4C.

Figure 6A:
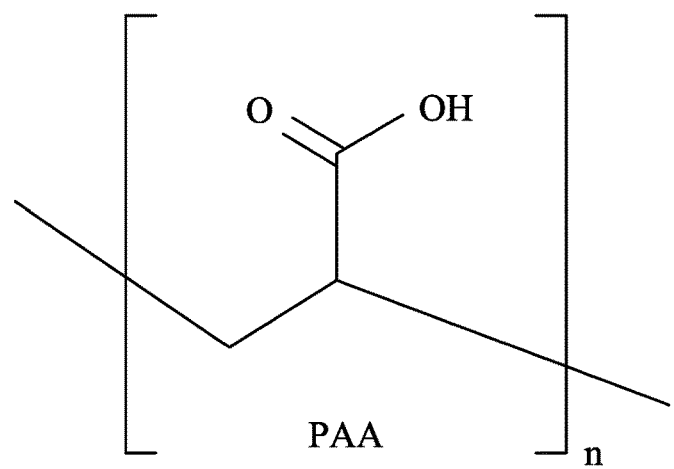
FIG. 6A shows a chemical structure of a poly acrylic acid.
Figure 6B:
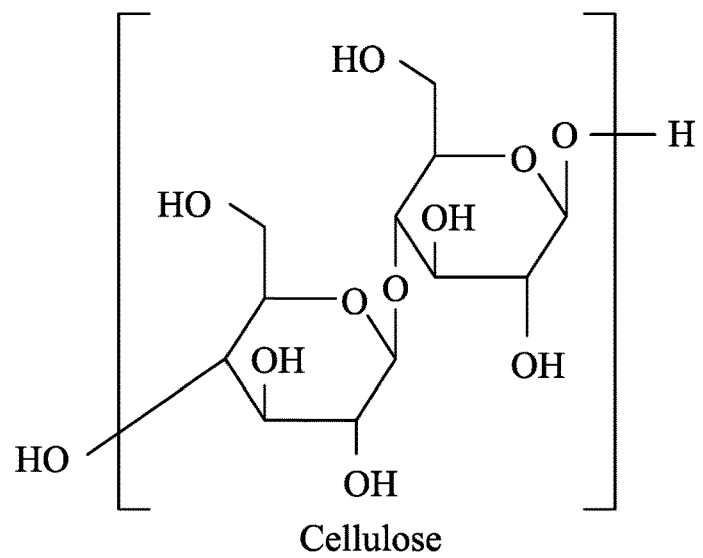
FIG. 6B shows a chemical structure of cellulose.
Figure 6C:
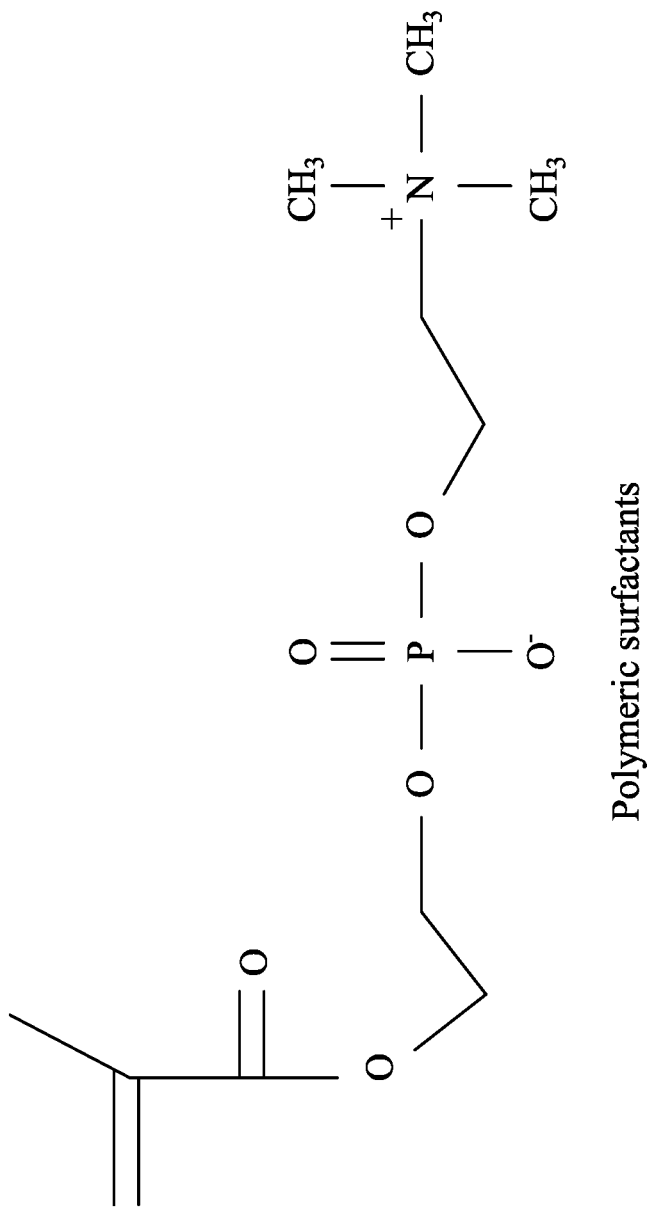
FIG. 6C shows a chemical structure of a polymeric surfactant.

A polymer 20P includes a water soluble polymer, such as a poly acrylic acid shown in FIG. 6A, cellulose shown in FIG. 6B or a polymeric surfactant shown in FIG. 6C. The polymer 20P can absorb or incorporate the particles 12 therein, thereby increasing the effective size of the particles 12 as shown in FIG. 4C. These polymers can be used singly or in any combination thereof. In some embodiments, the polymer 20P is a poly acrylic acid having a weight-average molecular weight ranging from about 1,000 to about 4,000,000.

Examples of the polymerizable material (monomers) include acrylic monomers, such as, but not limited to, acrylamide, methacrylamide, acrylate, acrylic acids and salts, acrylonitrile, bisphenol acrylics, carbohydrate monomers, fluorinated acrylics, maleimide, methacrylate and polyfunctional acrylics. These monomers can be polymerized by heating an aqueous solution including the monomers. In some embodiments, catalyst, such as hydrogen peroxide, sodium peroxide, persulphuric acid, persulphates, and/or sodium/potassium salts of persulphunic acid, can be utilized.

The polymeric surfactant includes at least one fluorine atom and/or at least one silicon atom, polyoxyethylene alkyl ethers, polyoxyethylene alkyl aryl ethers, polyoxyethylene-polyoxypropylene block copolymers, and polyoxyethylene sorbitan fatty acid esters, in some embodiments.

Specific examples of the polymeric surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether, polyoxyethylene cetyl ether, polyethylene glycol, polypropylene glycol, polyoxyethylene cetyl ether, combinations thereof, or the like.

In other embodiments, a polymerizable material is used as the chemical agent 20. In some embodiments, a crosslinking agent is used together with the polymerizable material. When a polymerizable material is used, heat and/or ultra violet (UV) light 30 is applied to the coated chemical solution 15 to induce polymerization, as shown in FIG. 4C. The UV light has a peak wavelength in a range from about 100 nm to about 400 nm. A low-pressure Hg lamp is used as a UV light source, in some embodiments.

The one or more chemical agents 20 (the surface modifier 20S and/or the polymer or polymerizable material 20P) are placed into a solvent in order to aid in the mixing and dispensing the chemical solution 15. To aid in the mixing and dispensing the chemical solution 15, the solvent is chosen at least in part based upon the materials chosen for the silane coupling agent or polymer.

In some embodiments, the solvent is water or a water based solvent. In other embodiments, the solvent is an organic solvent, and includes any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the chemical solution 15 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the chemical solution 15 are merely illustrative and are not intended to limit the embodiments. All such materials are fully intended to be included within the scope of the embodiments.

Additionally, while individual ones of the above described materials may be used as the solvent for the chemical solution 15, in other embodiments more than one of the above described materials are used. For example, in some embodiments, the solvent includes a mixture of two or more of the materials described. All such combinations are fully intended to be included within the scope of the embodiments.

After the modification operation, the remaining chemical solution 15 is removed and a drying operation is performed in some embodiments. The remaining chemical solution 15 can be removed by simply spinning the substrate at a higher speed, or removed by using another solution, such as water or an organic solvent. The drying process includes a heating in a temperature range from about 50° C. to 120° C. in some embodiments.

After the surface modification of the particles 12 by the surface modifier 20S or the polymer 20P, the size of the size-modified particles 40 (see, FIGS. 3A and 4D) is about 50 nm or more, about 100 nm or more or about 200 nm or more in some embodiments. In certain embodiments, the size of the particles after the surface modification is up to about 1000 μm, up to about 200 μm or up to about 50 μm.

Figure 3B:
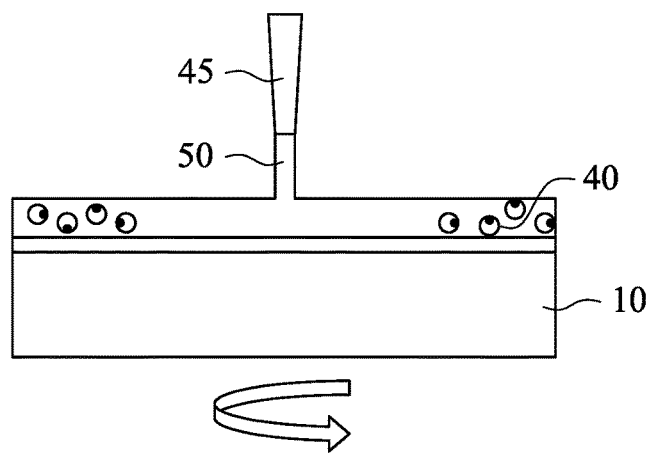

After the remaining chemical solution 15 is removed, a cleaning solution 50 is applied from a nozzle 45 onto a spinning substrate 10, as shown in FIG. 3B. The cleaning solution 50 is an organic solvent or an aqueous solution including $NH_4OH$ and $H_2O_2$ (SC1 slution), in some embodiments. The organic solvent can be an alcohol, such as isopropyl alcohol (IPA). The cleaning time is in a range from about 30 sec to 120 sec in some embodiments. In the cleaning process using the cleaning solution 50, no ultrasonic vibration is applied to the substrate and/or the cleaning solution 50 in some embodiments. In some embodiments, the substrate 10 is dipped in a cleaning solution 50 and held in a liquid bath.

In other embodiments, without removing the chemical solution 15 after the particle size modification, the cleaning solution 50 is applied. In other words, the cleaning solution 50 also removes the chemical solution 15.

Figure 4D:
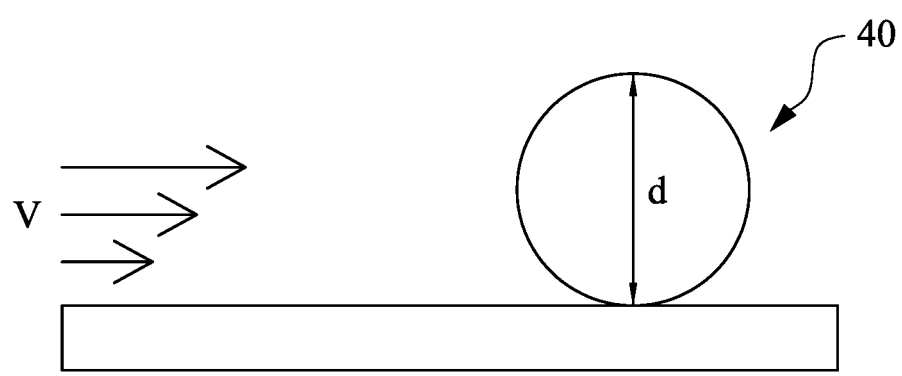
FIG. 4D shows a schematic view of particles size-modified according to an embodiment of the present disclosure.

As shown in FIGS. 4A and 4D, the initial particles 12 having a diameter less than, for example, about 50 nm are size-modified to size-modified particles 40 having a larger size, for example, about 100 nm or more. Accordingly, during the cleaning process using the cleaning solution 50, the size-modified particles are more easily and effectively removed. Since no ultrasound or no high-pressure cleaning fluid (e.g., pressurized at more than 2 hPa and less than 10 hPa, in some embodiments) is necessary, it is possible to prevent damage to fine patterned formed on the substrate 10.

Figure 3C:
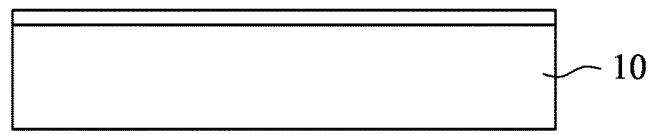

Further, a rinsing operation using de-ionized water is performed on the surface of the substrate 10 while the substrate spinning, and then a drying operation is performed, thereby obtaining a cleaned substrate 10 as shown in FIG. 3C.

Figure 7A:
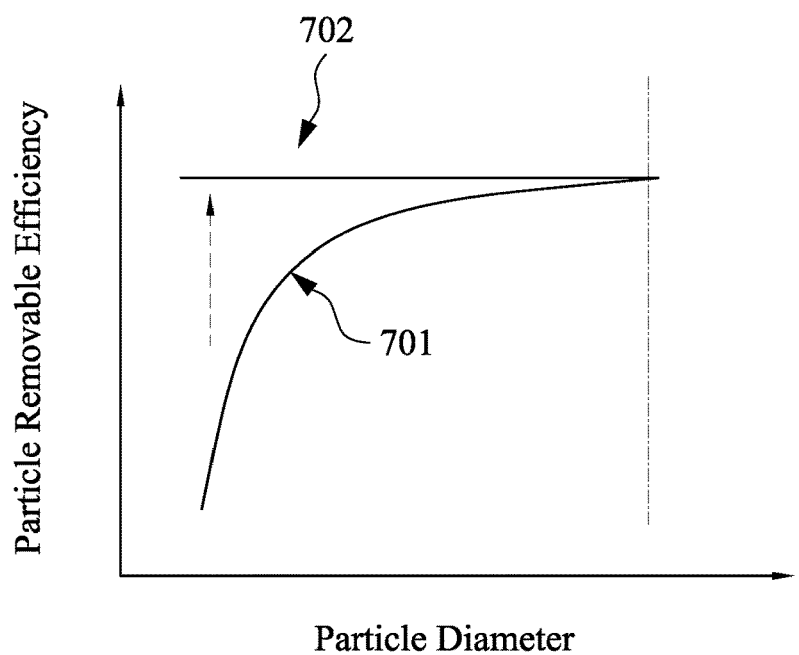
FIG. 7A shows the relationship between a particle size (diameter) of original particles and a particle removable efficiency according to an embodiment of the present disclosure.
Figure 7B:
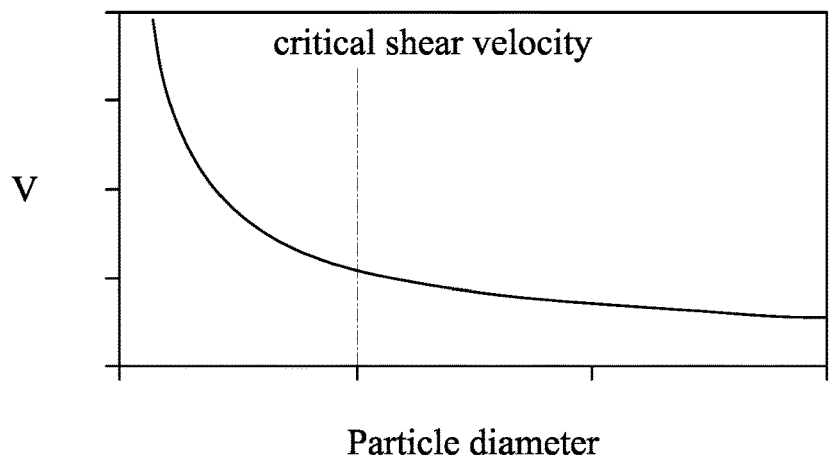
FIGS. 7B and 7C show the relationship between a particle size and a shear velocity of the cleaning fluid relating to an embodiment of the present disclosure.
Figure 7C:
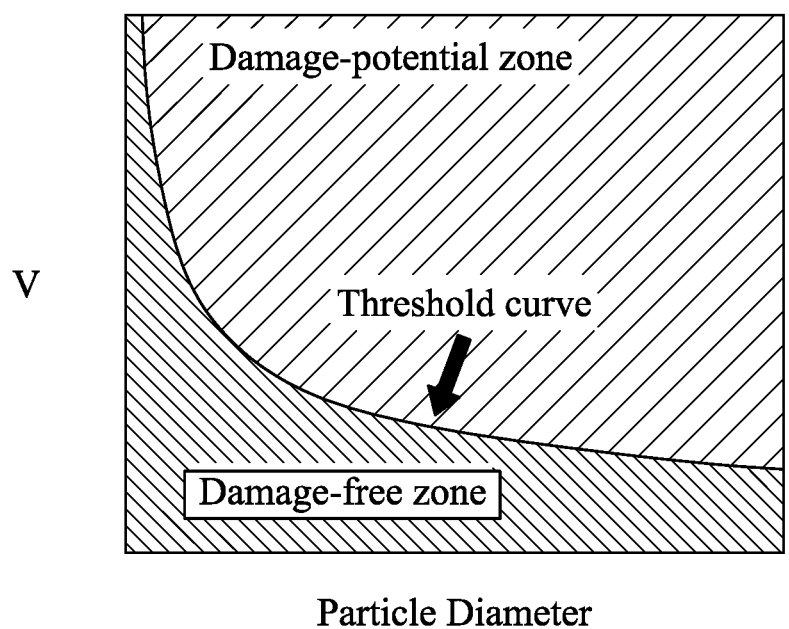

FIGS. 7A-7C show one or more advantageous effects of the present disclosure. In FIG. 7A, line 701 shows the relationship between a particle size (diameter) of the original particles and a particle removable efficiency for the particles without size modification, and line 702 shows the relationship between the particle size of the original particles and a particle removable efficiency for the particles with size modification. As shown in FIG. 7A, as set forth above, when the size of the particle become smaller, the particle removable efficiency drastically decreases, in particular, when the particle size is less than about 50 nm. In contrast, by utilizing the size modification operation as set forth above, particles having diameters less than about 50 nm are transferred into large particles having diameters more than about 100 nm, and thus the particle removable efficiency is improved for the particles having original sizes less than about 50 nm in some embodiments.

FIGS. 7B and 7C show the relationship between a particle size and a shear velocity of the cleaning fluid that removes given-size particles without causing damage to fine patterns formed over the substrate. As shown in FIGS. 7B and 7C, as the particle size become smaller, for example, less than about 50 nm, the shear velocity of the cleaning fluid rapidly increases. As set forth above, by increasing the sizes of the particles to, for example, more than about 100 nm, it is possible to reduce the velocity of the cleaning fluid and thus suppress damage to the fine patterns formed over the substrate. The velocity of the cleaning fluid can be adjusted by changing a pressure applied and/or rotational speed of the substrate. In some embodiments, a lower pressure in a range from the atmospheric pressure (not pressurized) to about 2 hPa can be used to pressurize the cleaning fluid.

Figure 8:
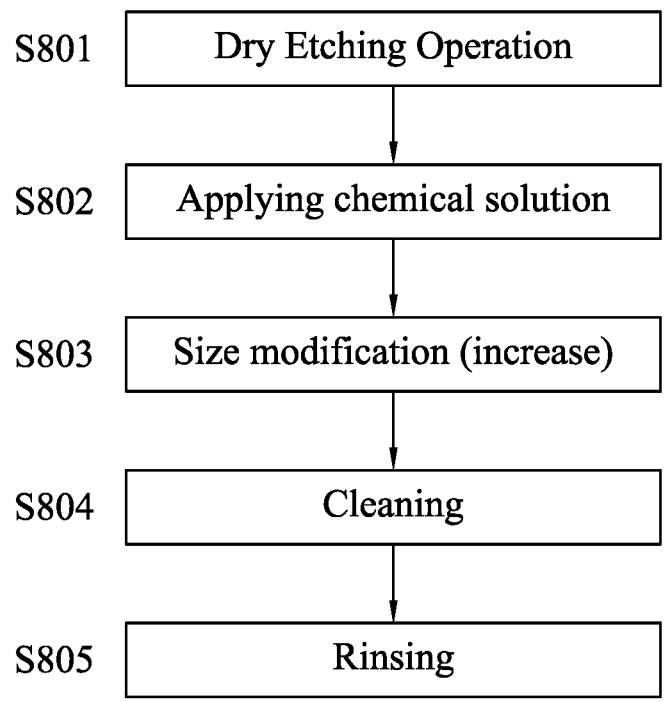
FIG. 8 is a flow chart illustrating a method of cleaning a substrate according to another embodiment of the present disclosure.

FIG. 8 is a flow chart illustrating a method of cleaning a substrate according to another embodiment of the present disclosure. It is understood that additional operations can be provided before, during, and after the operations shown by FIG. 8, and some of the operations described below can be replaced or eliminated, in other embodiments of the method. Material, configuration, dimensions and/or processes the same as or similar to the foregoing embodiments described with FIGS. 1A-7C may be employed in the following embodiments, and detailed explanation thereof may be omitted.

In S801 of FIG. 8, one or more plasma dry etching operations are performed on or over a target layer disposed over a substrate 10. In some embodiments, no photo resist pattern is disposed over the target layer. For example, the plasma dry etching is for patterning the target layer by using a hard mask pattern as an etching mask, for forming sidewalls over patterns (e.g., gate structures) or for an etch-back operation. During the plasma dry etching operation, particles 12 are generated and fall on the surface of the substrate 10.

Then, in S802, a chemical solution 15 containing one or more chemical agents 20 are applied onto the substrate contaminated with the particles 12. In S803, similar to S101 of FIG. 1, the particle sizes are increased. When the chemical agent 20 includes a polymerizable material, heat and/or UV light is applied to polymerize the polymerizable material, so that the polymerized material absorbs or incorporates the particles 12. Then, in S804, similar to S102 of FIG. 1, a cleaning solution 50 such as the SC1 solution is applied to remove the size-modified particles 40, and then a rinsing operation S805 similar to S103 of FIG. 1 is performed. With the foregoing cleaning operation, it is possible to effectively remove nano-size particles after the plasma dry processing.

Figure 9:
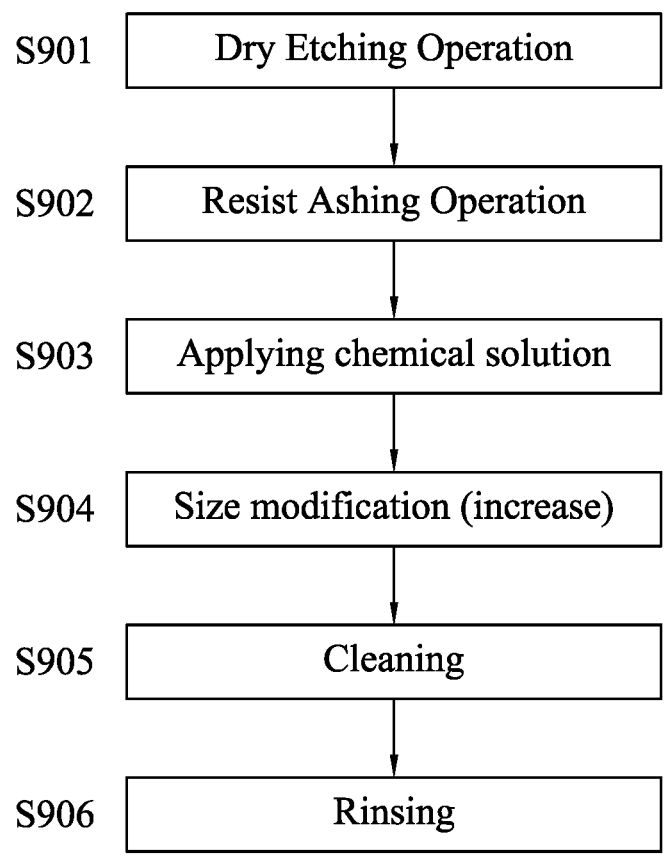
FIG. 9 is a flow chart illustrating a method of cleaning a substrate according to another embodiment of the present disclosure.

FIG. 9 is a flow chart illustrating a method of cleaning a substrate according to another embodiment of the present disclosure. It is understood that additional operations can be provided before, during, and after processes shown by FIG. 9, and some of the operations described below can be replaced or eliminated, in other embodiments of the method. Material, configuration, dimensions and/or processes the same as or similar to the foregoing embodiments described with FIGS. 1A-8 may be employed in the following embodiments, and detailed explanation thereof may be omitted.

In S901 of FIG. 9, one or more plasma dry etching operations are performed on or over a target layer disposed over a substrate 10. In some embodiments, a photo resist pattern is formed over the target layer. For example, the plasma dry etching is for patterning the target layer by using the resist pattern as an etching mask or for an etch-back operation using a photo resist or an organic material layer.

After the etching operation, a resist ashing operation is performed to remove the photo resist layer at S902. The resist ashing operation is a plasma process in some embodiments. During the plasma dry etching operation and/or the resist ashing operation, particles 12 are generated and fall on the surface of the substrate 10.

Then, in S903, a chemical solution 15 containing one or more chemical agents 20 are applied onto the substrate contaminated with the particles 12. In S904, similar to S101 of FIG. 1, the particle sizes are increased. When the chemical agents 20 include a polymerizable material, heat and/or UV light is applied to polymerize the polymerizable material, so that the polymerized material absorbs or incorporates the particles 12. Then, in S905, similar to S102 of FIG. 1, a cleaning solution 50 such as the SC1 solution is applied to remove the size-modified particles 40, and then a rinsing operation S906 similar to S103 of FIG. 1 is performed. With the foregoing cleaning operation, it is possible to effectively remove nano-size particles after the plasma processing.

Figure 10:
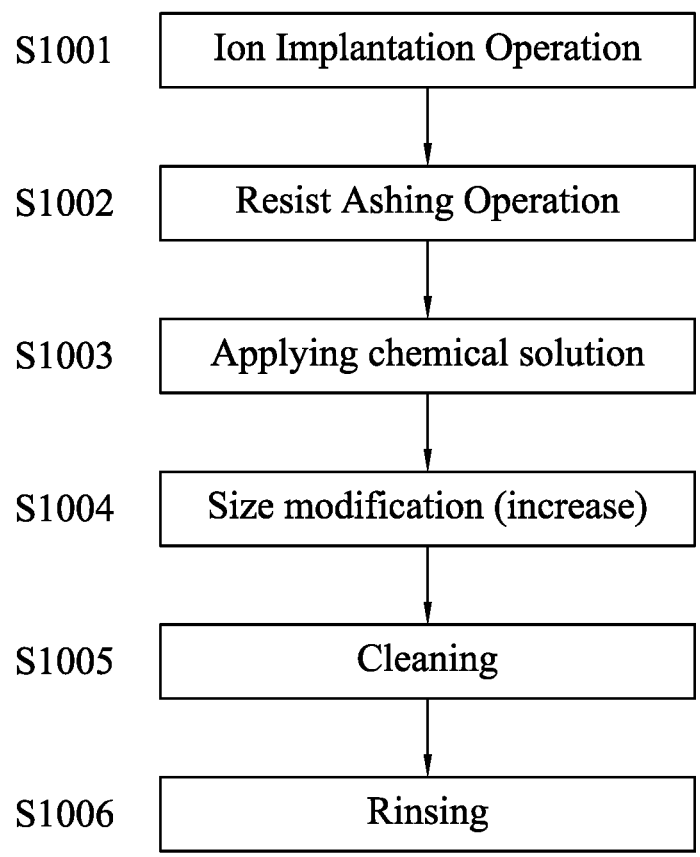
FIG. 10 is a flow chart illustrating a method of cleaning a substrate according to another embodiment of the present disclosure.

FIG. 10 is a flow chart illustrating a method of cleaning a substrate according to another embodiment of the present disclosure. It is understood that additional operations can be provided before, during, and after processes shown by FIG. 10, and some of the operations described below can be replaced or eliminated, in other embodiments of the method. Material, configuration, dimensions and/or processes the same as or similar to the foregoing embodiments described with FIGS. 1A-9 may be employed in the following embodiments, and detailed explanation thereof may be omitted.

In S1001 of FIG. 10, one or more ion implantation operations are performed on or over the substrate 10. In some embodiments, a photo resist pattern is formed as an implantation mask pattern.

After the ion implantation operation, a resist ashing operation is performed to remove the photo resist layer is performed at S1002. The resist ashing operation is a plasma process in some embodiments. During the ion implantation operation and/or the resist ashing operation, particles 12 are generated and fall on the surface of the substrate 10.

Then, in S1003, a chemical solution 15 containing one or more chemical agents 20 are applied onto the substrate contaminated with the particles 12. In S1004, similar to S101 of FIG. 1, the particle sizes are increased. When the chemical agents 20 include a polymerizable material, heat and/or UV light is applied to polymerize the polymerizable material, so that the polymerized material absorbs or incorporates the particles 12. Then, in S1005, similar to S102 of FIG. 1, a cleaning solution 50 such as the SC1 solution is applied to remove the size-modified particles 40, and then a rinsing operation S1006 similar to S103 of FIG. 1 is performed. With the foregoing cleaning operation, it is possible to effectively remove nano-size particles after the ion implantation process and plasma processing.

Figure 11:
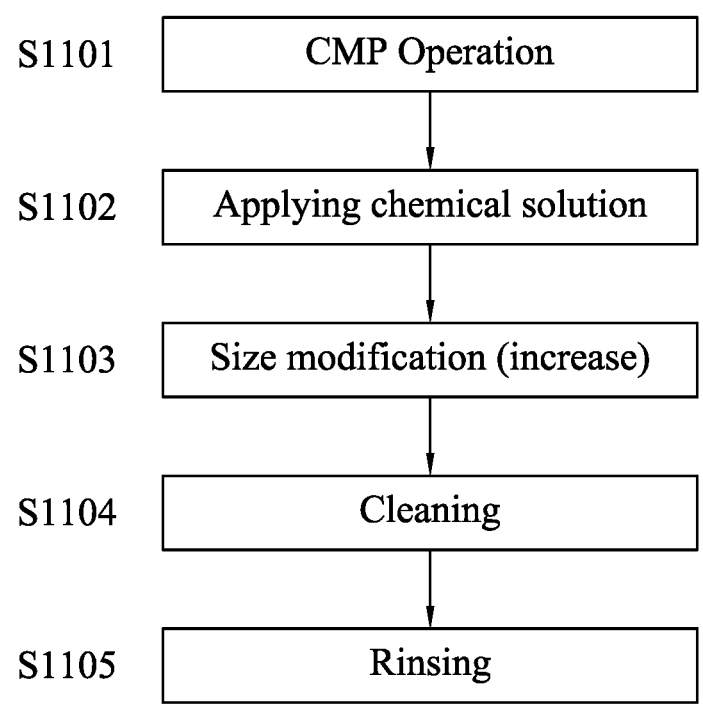
FIG. 11 is a flow chart illustrating a method of cleaning a substrate according to another embodiment of the present disclosure.

FIG. 11 is a flow chart illustrating a method of cleaning a substrate according to another embodiment of the present disclosure. It is understood that additional operations can be provided before, during, and after processes shown by FIG. 11, and some of the operations described below can be replaced or eliminated, in other embodiments of the method. Material, configuration, dimensions and/or processes the same as or similar to the foregoing embodiments described with FIGS. 1A-10 may be employed in the following embodiments, and detailed explanation thereof may be omitted.

In S1101 of FIG. 11, one or more chemical mechanical polishing operations are performed on or over a target layer disposed over the substrate 10. A CMP process is a planarization process which uses a polishing pad and chemical slurry. The slurry is a colloid of a material that acts as a chemical etchant for etching the material at the target layer over the substrate 10 in some embodiments. The polishing pad is rotated relative to the wafer while slurry is disposed so as to remove material and smooth any irregular topography. The abrasive particles in the slurry are materials such as, silica, ceria, and/or alumina. In an embodiment, the abrasive particles have a generally uniform shape and a narrow size distribution, with an average particle size ranging from about 10 nm to about 100 nm or more depending on the application for which it is being used. During the CMP operation, particles 12 are generated and fall on the surface of the substrate 10. In some embodiments, the particles 12 include abrasive particles in the slurry.

Figure 12:
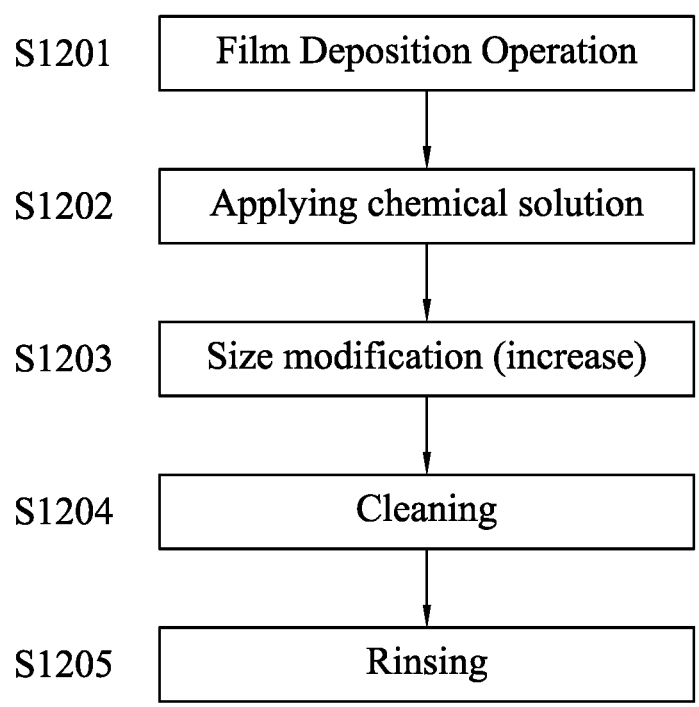
FIG. 12 is a flow chart illustrating a method of cleaning a substrate according to another embodiment of the present disclosure.

After the CMP operation, in S1102, a chemical solution 15 containing one or more chemical agents 20 are applied onto the substrate contaminated with the particles 12. In some embodiments, a cleaning operation using de-ionized water is performed after the CMP operation and before the application of the chemical solution. In S1103, similar to S101 of FIG. 1, the particle sizes are increased. When the chemical agents 20 include a polymerizable material, heat and/or UV light is applied to polymerize the polymerizable material, so that the polymerized material absorbs or incorporates the particles 12. Then, in S1104, similar to S102 of FIG. 1, a cleaning solution 50 such as the SC1 solution is applied to remove the size-modified particles 40, and then a rinsing operation S1105 similar to S103 of FIG. 1 is performed. With the foregoing cleaning operation, it is possible to effectively remove nano-size particles after the CMP operation. FIG. 12 is a flow chart illustrating a method of cleaning a substrate according to another embodiment of the present disclosure. It is understood that additional operations can be provided before, during, and after processes shown by FIG. 12, and some of the operations described below can be replaced or eliminated, for additional embodiments of the method. Material, configuration, dimensions and/or processes the same as or similar to the foregoing embodiments described with FIGS. 1A-11 may be employed in the following embodiments, and detailed explanation thereof may be omitted.

In S1201 of FIG. 12, one or more film deposition operations are performed on or over a target layer disposed over a substrate 10. The film deposition operation includes, for example, physical vapor deposition (PVD), molecular beam epitaxy (MBE), pulsed laser deposition (PLD), atomic layer deposition (ALD), electron beam (e-beam) epitaxy, chemical vapor deposition (CVD), such as low pressure CVD (LPCVD), plasma enhanced CVD (PECVD) or metal-organic CVD (MOCVD), and electro plating. During the film formation operation, particles 12 are generated and fall on the surface of the substrate 10.

Then, in S1202, a chemical solution 15 containing one or more chemical agents 20 are applied onto the substrate contaminated with the particles 12. In S1203, similar to S101 of FIG. 1, the particle sizes are increased. When the chemical agents 20 include a polymerizable material, heat and/or UV light is applied to polymerize the polymerizable material, so that the polymerized material absorbs or incorporates the particles 12. Then, in S1204, similar to S102 of FIG. 1, a cleaning solution 50 such as the SC1 solution is applied to remove the size-modified particles 40, and then a rinsing operation S1205 similar to S103 of FIG. 1 is performed. With the foregoing cleaning operation, it is possible to effectively remove nano-size particles after the film forming processing.

Figure 13:
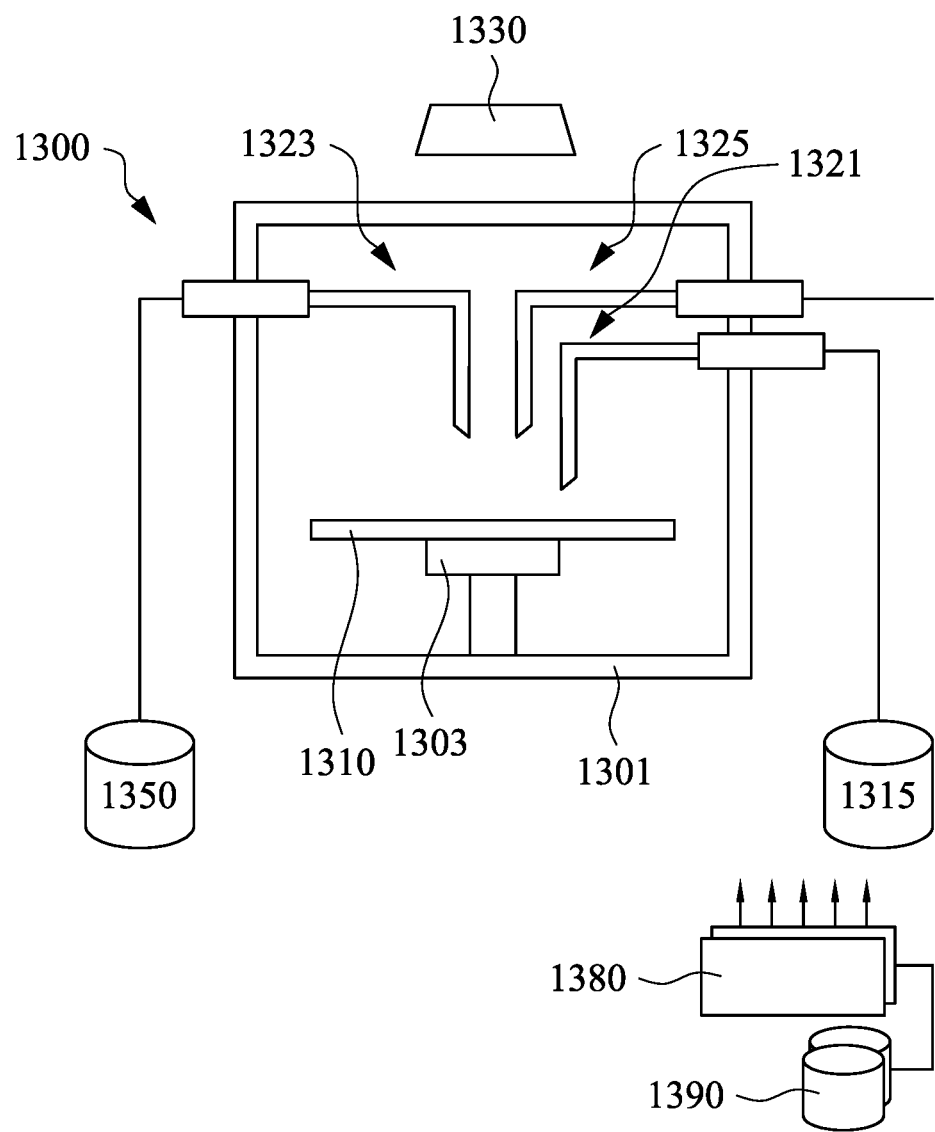
FIG. 13 is a schematic view of a cleaning apparatus according to an embodiment of the present disclosure.

FIG. 13 is a schematic view of a cleaning apparatus according to an embodiment of the present disclosure. One of ordinary skill in the art would understand that one or more additional features are utilized with an apparatus shown in FIG. 13.

A cleaning apparatus 1300 includes a housing or an enclosure 1301 in which a substrate holder 1303 is disposed. The substrate holder is configured to hold a substrate 1310 and to rotate the substrate at various speeds. The apparatus includes several fluid nozzles, including a fluid nozzle 1321 configured to dispense a chemical solution 15, a fluid nozzle 1323 configured to dispense a cleaning solution 50, and a fluid nozzle 1325 configured to dispense de-ionized water, onto the wafer 1310. The nozzles are movable in transverse directions and in the vertical direction in some embodiments.

The fluid nozzle 1321 is fluidly connected to a chemical solution source 1315 holding the chemical solution 15, and the fluid nozzle 1323 is fluidly connected to a cleaning solution source 1350 holding the cleaning solution 50. Further, the fluid nozzle 1325 is fluidly connected to a de-ionized water source, which may be a facility de-ionized water source. Further, a UV light source or a heater 1330 is disposed inside or outside the housing 1301.

At least a part of the operations of the cleaning apparatus 1300 is controlled by one or more controllers 1380 connected to or including one or more storages 1390. The controller 1380 is a computer system including one or more processors and the storage 1390 stores a control program, in some embodiments. When the control program is executed by the processor, the controller 1380 controls the operations of, for example, the substrate holder 1303, the nozzles 1321, 1323 and 1325, fluid flows of the solutions flowing therethrough, and a heater/UV light source 1330.

According to the executed program, the aforementioned cleaning operations are performed.

It will be understood that not all advantages have been necessarily discussed herein, no particular advantage is required for all embodiments or examples, and other embodiments or examples may offer different advantages.

For example, according to one or more foregoing embodiments, a particle size (diameter) is increased by one or more chemical components in order to increase the hydrodynamic drag force. By increasing particle size, particle removal efficiency can be improved.

In accordance with an aspect of the present disclosure, in a method of cleaning a substrate, a solution including a size-modification material is applied on a substrate, on which particles to be removed are disposed. Size-modified particles having a larger size than the particles to be removed are generated from the particles to be removed and the size-modification material. The size-modified particles are removed from the substrate. In one or more of the foregoing or following embodiments, the size-modification material includes a surface modification material that attaches to a surface of the particles to be removed in the generating size-modified particles. In one or more of the foregoing or following embodiments, the surface modification material is a silane coupling agent having a general formula $SiX(CH_3)_n(OR)_{3-n}$, where X is functional group coupled to Si and R is an alkoxy group and n is 0, 1, 2 or 3. In one or more of the foregoing or following embodiments, X is one selected from the group consisting of vinyl, epoxy, methacryloxy, acryloxy, amino and mercapto. In one or more of the foregoing or following embodiments, the alkoxy group is one selected from the group consisting of methoxy, ethoxy, dialkoxy and trialkoxy. In one or more of the foregoing or following embodiments, the functional group X is directly bonded to Si or connected by an alkyl chain having a carbon number less than 18. In one or more of the foregoing or following embodiments, the alkyl chain has a straight chain. In one or more of the foregoing or following embodiments, the size-modification material includes a polymerizable material or a polymer. In one or more of the foregoing or following embodiments, the size-modification material includes one selected from the group consisting of a poly acrylic acid, cellulose and a polymeric surfactant. In one or more of the foregoing or following embodiments, the polymer is a poly acrylic acid having a weight-average molecular weight ranging from 1,000 to 4,000,000. In one or more of the foregoing or following embodiments, the size-modification material includes a polymerizable material, and the method further comprises inducing polymerization by applying heat or light, thereby generating size-modified particles. In one or more of the foregoing or following embodiments, the removing the size-modified particles from the substrate includes applying an organic solvent or an aqueous solution including $NH_4OH$ and $H_2O_2$. In one or more of the foregoing or following embodiments, the removing the size-modified particles from the substrate further includes, after applying an organic solvent or an aqueous solution including $NH_4OH$ and $H_2O_2$, applying water, thereby rinsing the substrate. In one or more of the foregoing or following embodiments, an average particle size of the particles to be removed before size modification ranges from 0.1 nm to 40 nm. In one or more of the foregoing or following embodiments, an average size of the size-modified particles ranges from 50 nm to 1000 μm.

In accordance with another aspect of the present disclosure, in a method of manufacturing a semiconductor device, plasma processing is performed on one or more layers disposed on a semiconductor wafer. A solution including a size-modification material is applied over the semiconductor wafer, on which particles caused by the plasma processing are disposed. Size-modified particles having a larger size than the particles caused by the plasma processing are generated, from the particles caused by the plasma processing and the size-modification material. The size-modified particles from the semiconductor wafer. In one or more of the foregoing or following embodiments, the plasma processing includes one selected from the group consisting of plasma dry etching, plasma resist ashing and plasma film deposition. In one or more of the foregoing or following embodiments, the size-modification material is a silane coupling agent. In one or more of the foregoing or following embodiments, the size-modification material includes a polymerizable material or a polymer.

In accordance with another aspect of the present disclosure, in a method of manufacturing a semiconductor device, chemical mechanical polishing (CMP) processing is performed on one or more layers disposed on a semiconductor wafer. A solution including a size-modification material is applied over the semiconductor wafer, on which particles caused by the CMP processing are disposed. Size-modified particles having a larger size than the particles caused by the CMP processing are generated from the particles caused by the CMP processing and the size-modification material. The size-modified particles are removed from the semiconductor wafer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a substrate, comprising:
   applying a solution including a size-modification material on a substrate, on which particles to be removed are disposed;
   generating, on the substrate, size-modified particles having a larger size than the particles to be removed, from the particles disposed on the substrate and the size-modification material; and
   removing the size-modified particles from the substrate, wherein;
   the size-modification material includes a surface modification material that attaches to a surface of the particles to be removed in the generating size-modified particles, and
   the surface modification material is a silane coupling agent having a general formula $SiX(CH_3)_n(OR)_{3-n}$, where X is functional group coupled to Si and R is an alkoxy group and n is 0, 1, 2 or 3.

2. The method of claim 1, wherein X is one selected from the group consisting of vinyl, epoxy, methacryloxy, acryloxy, amino and mercapto.

3. The method of claim 1, wherein the alkoxy group is one selected from the group consisting of methoxy, ethoxy, dialkoxy and trialkoxy.

4. The method of claim 1, wherein an average particle size of the particles to be removed before size modification ranges from 0.1 nm to 40 nm.

5. The method of claim 4, wherein an average size of the size-modified particles ranges from 50 nm to 1000 μm.

6. The method of claim 1, wherein the functional group X is directly bonded to Si or connected by an alkyl chain having a carbon number less than 18.

7. The method of claim 6, wherein the alkyl chain has a straight chain.

8. The method of claim 1, wherein the removing the size-modified particles from the substrate includes applying an organic solvent or an aqueous solution including $NH_4OH$ and $H_2O_2$.

9. The method of claim 8, wherein the removing the size-modified particles from the substrate further includes, after applying the organic solvent or the aqueous solution including $NH_4OH$ and $H_2O_2$, applying water, thereby rinsing the substrate.

10. A method of manufacturing a semiconductor device, the method comprising:
    performing plasma processing on one or more layers disposed on a semiconductor wafer;
    applying a solution including a size-modification material over the semiconductor wafer, on which particles caused by the plasma processing are disposed, the size-modification material includes a polymerizable material;
    generating, on the semiconductor wafer, size-modified particles having a larger size than the particles caused by the plasma processing, from the particles caused by the plasma processing disposed on the semiconductor wafer and the size-modification material via a polymerization process; and removing the size-modified particles from the semiconductor wafer.

11. The method of claim 10, wherein the plasma processing includes one selected from the group consisting of plasma dry etching, plasma resist ashing and plasma film deposition.

12. The method of claim 10, wherein the polymerization process is performed by applying heat.

13. The method of claim 10, wherein the polymerization process is performed by applying ultra violet light.

14. The method of claim 10, wherein the polymerizable material is an acrylic monomer selected from the group consisting of an acrylamide, a methacrylamide, an acrylate, an acrylonitrile, a bisphenol acrylic, a carbohydrate monomer, a fluorinated acrylic, a maleimide and a methacrylate.

15. A method of manufacturing a semiconductor device, the method comprising:

performing chemical mechanical polishing (CMP) processing on one or more layers disposed on a semiconductor wafer;

applying a solution including a size-modification material over the semiconductor wafer, on which particles caused by the CMP processing are disposed, the size-modification material includes a polymerizable material;

generating, on the semiconductor wafer, size-modified particles having a larger size than the particles caused by the CMP processing, from the particles caused by the CMP processing disposed on the semiconductor wafer and the size-modification material via a polymerization process; and removing the size-modified particles from the semiconductor wafer.

16. The method of claim 15, wherein the polymerization process is performed by applying heat.

17. The method of claim 15, wherein the polymerization process is performed by applying ultra violet light.

18. The method of claim 15, wherein the polymerizable material is an acrylic monomer selected from the group consisting of an acrylamide, a methacrylamide, an acrylate, an acrylonitrile, a bisphenol acrylic, a carbohydrate monomer, a fluorinated acrylic, a maleimide and a methacrylate.

* * * * *